(12) United States Patent
Lee et al.

(10) Patent No.: US 7,105,401 B2
(45) Date of Patent: Sep. 12, 2006

(54) CAPACITOR FOR SEMICONDUCTOR DEVICE, MANUFACTURING METHOD THEREOF, AND ELECTRONIC DEVICE EMPLOYING THE SAME

(75) Inventors: Jung-hyun Lee, Yongin (KR); Yo-sep Min, Seoul (KR); Young-jin Cho, Incheon (KR)

(73) Assignee: Samsung Electronics Co., Ltd., Suwon (KW)

( * ) Notice: Subject to any disclaimer, the term of this patent is extended or adjusted under 35 U.S.C. 154(b) by 0 days.

(21) Appl. No.: 10/930,953

(22) Filed: Sep. 1, 2004

(65) Prior Publication Data

US 2005/0042836 A1 Feb. 24, 2005

Related U.S. Application Data

(62) Division of application No. 10/370,625, filed on Feb. 24, 2003, now abandoned.

(30) Foreign Application Priority Data

Feb. 28, 2002 (KR) .............................. 2002-10982

(51) Int. Cl.
*H01L 21/8242* (2006.01)
(52) U.S. Cl. .................. 438/240; 438/239; 438/650; 438/686
(58) Field of Classification Search ........ 438/239–240, 438/253–256, 396–399, 648, 650, 652, 656, 438/685, 686, 785
See application file for complete search history.

(56) References Cited

U.S. PATENT DOCUMENTS 6,144,069 A 11/2000 Tung 6,162,293 A 12/2000 Kijima et al.
2002/0001858 A1 1/2002 Kim et al.
2002/0074584 A1 6/2002 Yang

FOREIGN PATENT DOCUMENTS

| EP | 0 540 994 A1 | 5/1993 |
| KR | 1999-0080412 | 11/1999 |
| KR | 2002-0013189 | 2/2002 |

OTHER PUBLICATIONS

Patent Abstracts of Japan, vol. 0182, No. 13 (E-1538), Apr. 15, 1994 & JP 6-013542 (Pub. Date:Jan. 21, 1994).
*Entitled: "Engineered Tantalum Aluminate and Hafnium Aluminate and Films for Ultrathin . . . ".
**Entitled: "High-kappa Gate Dielectrics: Current Status and Materials Properties Considerations".
***Entitled: "Common and Unique Aspects of Perovskite Thin Film CVD Processes".

*Primary Examiner*—Ori Nadav
(74) *Attorney, Agent, or Firm*—Lee & Morse, P.C.

(57) ABSTRACT

A capacitor for use in a semiconductor device, a method of fabricating the capacitor, and an electronic device adopting the capacitor, wherein the capacitor includes upper and lower electrodes, each formed of a platinum group metal; a thin dielectric layer disposed between the upper and lower electrodes; and a buffer layer disposed between the lower electrode and the thin dielectric layer, the buffer layer including a metal oxide of Group 3, 4, or 13. In an embodiment, the method of fabricating includes absorbing CO on a surface of a lower electrode of a platinum group metal, placing the lower electrode under a reducing atmosphere to produce a lattice oxygen, using the lattice oxygen to form a thin dielectric layer by performing an ALD process using a precursor for the thin dielectric layer, and forming an upper electrode of a platinum group metal on the thin dielectric layer.

3 Claims, 5 Drawing Sheets

CAPACITOR FOR SEMICONDUCTOR DEVICE, MANUFACTURING METHOD THEREOF, AND ELECTRONIC DEVICE EMPLOYING THE SAME

This application is a Division of application Ser. No. 10/370,625, filed Feb. 24, 2003, now abandoned.

BACKGROUND OF THE INVENTION

1. Field of the Invention

The present invention relates to a capacitor for a semiconductor device. More particularly, the present invention relates to a capacitor for use in a semiconductor device having an ability to effectively suppress the oxidization of a material for an electrode when forming a thin dielectric layer, a manufacturing method thereof, and an electronic device that employs the capacitor and thus may be highly integrated.

2. Description of the Related Art

The more integrated a memory is, the smaller the size of a unit cell and the smaller the area of a capacitor. Thus, to realize a capacitor having a large electrostatic capacity in a limited area, extensive research into the use of a capacitor dielectric having a large permittivity, e.g., a high-dielectric material, has been conducted.

High-dielectric materials include tantalum oxide (TaO) and strontium titanium oxide ($SrTiO_3$), which have a larger permittivity than low-dielectric materials such as $SiO_2$ and $Si_3N_4$. However, despite the use of a high-dielectric material, a three-dimensional capacitor is still required to realize a capacitor having a large capacitance. To this end, an atomic layer deposition (ALD) method is used.

According to the ALD method, a desired metal oxide thin dielectric film is obtained by chemically absorbing an organometallic compound, which is a precursor, on a substrate, and processing the thin film under an oxygen atmosphere. The ALD method is advantageous in that an organic substance included in a precursor can be removed by a strong oxidizer since the precursor and the oxidizer are introduced using time division.

However, if a lower electrode, which is to be formed below a thin dielectric layer when forming an atomic layer, is formed of a material that is prone to oxidization, e.g., ruthenium (Ru), the Ru electrode may be deformed and the thin dielectric layer may deteriorate, as shown in FIG. 1. Therefore, it is difficult to highly integrate the thin dielectric layer.

FIG. 1 illustrates a capacitor in which a thin strontium titanium oxide ($SrTiO_3$) layer is formed on a Ru lower electrode by a conventional $O_3$ atomic layer deposition (ALD) method. Referring to FIG. 1, it is noted that the conventional $O_3$ ALD method causes a protrusion of the Ru lower electrode to be generated in the capacitor.

As shown in FIG. 2, Ru easily changes into $RuO_2$ or $RuO_4$ under an oxygen atmosphere, which causes the deformation of the Ru electrode.

SUMMARY OF THE INVENTION

To solve the above-described problems, it is a first feature of an embodiment of the present invention to provide a capacitor for use in a semiconductor device, in which the oxidization of a material for an electrode is effectively suppressed when forming a thin dielectric layer.

It is a second a feature of an embodiment of the present invention to provide a method of fabricating such a capacitor.

It is a third a feature of an embodiment of the present invention to provide an electronic device employing such a capacitor, in which a thin dielectric layer may be highly integrated, and a method for forming the same.

Accordingly, to provide the first feature of an embodiment of the present invention, there is provided a capacitor for use in a semiconductor device including upper and lower electrodes, each formed of a platinum group metal, a thin dielectric layer disposed between the upper and lower electrodes, and a buffer layer disposed between the lower electrode and the thin dielectric layer, the buffer layer including a metal oxide of Group 3, 4, or 13.

To provide an aspect of the second feature of an embodiment of the present invention, there is provided a method of fabricating such a capacitor for use in a semiconductor device including forming a buffer layer on a lower electrode of a platinum group metal by performing an atomic layer deposition (ALD) process using a precursor for the buffer layer, forming a thin dielectric layer by performing the ALD process using a precursor for a thin dielectric layer on the buffer layer, and forming an upper electrode of a platinum group metal on the thin dielectric layer.

To provide another aspect of the second feature of an embodiment of the present invention, there is provided a method of fabricating such a capacitor for use in a semiconductor device including absorbing CO on a surface of a lower electrode of a platinum group metal, placing the lower electrode under a reducing atmosphere to produce a lattice oxygen, using the lattice oxygen to form a thin dielectric layer by performing an ALD process using a precursor for the thin dielectric layer, and forming an upper electrode of a platinum group metal on the thin dielectric layer.

To provide the third feature of an embodiment of the present invention, there is provided an electronic device employing a capacitor for a semiconductor device according to an embodiment of the present invention.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE INVENTION

Figure 1:
FIG. 1 illustrates a view of a capacitor formed by a conventional $O_3$ atomic layer deposition (ALD) method.
Figure 2:
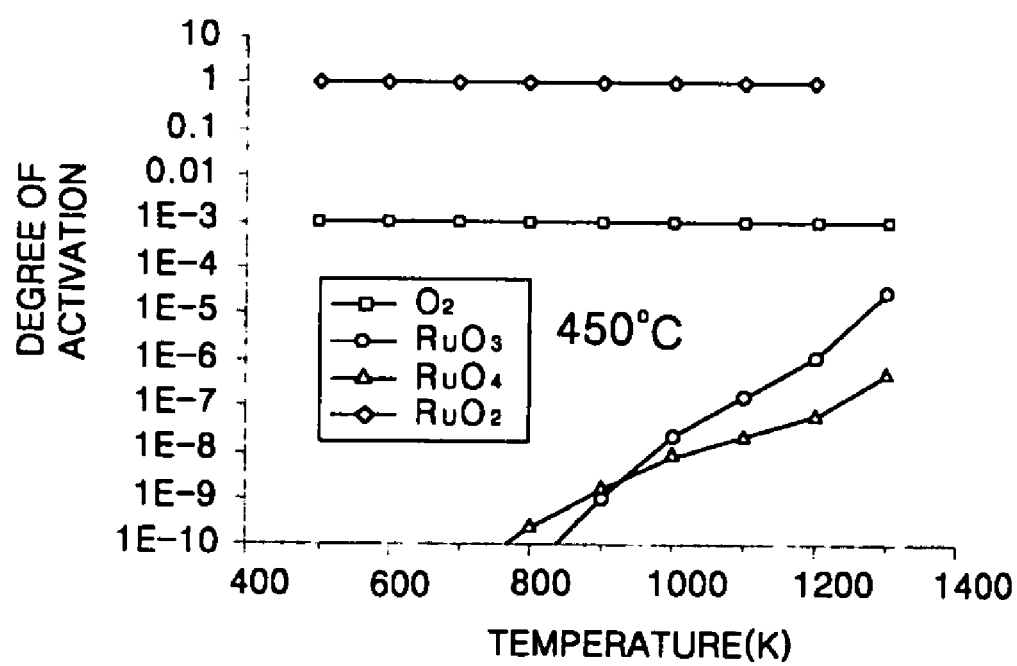
FIG. 2 is a graph illustrating variations in the degree of activation, according to temperature, of ruthenium (Ru) oxide in the capacitor of FIG. 1.

Korean Patent Application No. 2002-10982, entitled "Capacitor For Semiconductor Device, Manufacturing Method Thereof, And Electronic Device," filed on Feb. 28, 2002, is incorporated by reference herein in its entirety.

In the present invention, a buffer layer is formed between a thin dielectric layer and an electrode to prevent the oxidization of a platinum metal when forming the thin dielectric film. Preferably, ruthenium (Ru) is the platinum metal used as a material for the electrode. The buffer layer is formed of a metal oxide of Group 3, 4, or 13, preferably, at least one selected from the group consisting of $TiO_2$, $Al_2O_3$, $Ta_2O_5$, and $HfO_2$. Such a buffer layer may be formed by an atomic layer deposition (ALD) of a precursor for forming the buffer layer. The precursor is an organometallic compound having a small sized ligand or that is easily decomposed when being absorbed on a substrate and causes the chemical absorption of a by-product. The use of such an organometallic compound allows an atomic layer of a higher packing density to be formed on an electrode.

A metal precursor includes $Ti(i-OPr)_4$ or $Ti(i-OPr)_2(tmhd)_2$ for a $TiO_2$ buffer layer (where tmhd indicates tetramethylheptanedionate, and i-OPr indicates isopropoxy); $Al(CH_3)_3$ or $AlCl_3$ for an $Al_2O_3$ buffer layer; $Ta(OEt)_5$ (where OEt indicates ethoxide) for a $Ta_2O_5$ buffer layer; and $HfCl_4$ or $Hf(OBu)_4$ for an $HfO_2$ buffer layer.

As described above, if an atomic layer having a high packing density is formed on an electrode, the surface of a Ru electrode is not directly in contact with ozone ($O_3$) or oxygen when a thin dielectric layer is formed. Therefore, it is possible to prevent deformation of the electrode or deterioration of the characteristics of a thin dielectric layer caused by the oxidization of the electrode.

The vapor deposition temperature of the precursor for a buffer layer depends largely on the characteristics of the precursor, but preferably is between about 200–500° C. This is because the reactivity between the precursor and $O_3$, which is used as an oxidizer, decreases when the deposition temperature is less than 200° C., and the precursor decomposes when the deposition temperature is greater than 500° C., thereby preventing formation of a buffer layer using the ALD method.

Hereinafter, a method of fabricating a capacitor according to the present invention for use in a semiconductor device will be described.

First, a lower electrode is formed of a platinum group metal. The platinum group metal is at least one element selected from the group consisting of ruthenium (Ru), osmium (Os), iridium (Ir), and platinum (Pt).

Then, the ALD process is performed using a precursor for a buffer layer on the lower electrode to form a buffer layer.

Thereafter, the ALD process is performed using a precursor for a thin dielectric layer on the buffer layer to form a thin dielectric layer. Preferably, the thin dielectric layer is formed of $SrTiO_3$, $BaTiO_3$, $Pb(Zr,Ti)O_3$, or the like. To make the thin dielectric layer of $SrTiO_3$, one of $Sr(tmhd)_2$ or $Sr(methd)_2$ (where methd indicates methoxyethoxy tetramethylheptanedionate) is selected as the Sr source, one of $TiO(tmhd)_2$ or $TiO(i-OPr)_2(tmhd)_2$ is selected as the Ti source, and then the selected elements are mixed together. Next, the ALD process is performed using the precursor for the thin dielectric layer and oxygen gas or a heat source. Preferably, the vapor deposition temperature of an atomic layer is between about 300–500° C.

Then, the capacitor for use in a semiconductor device according to the present invention is completed by forming an upper electrode on the thin dielectric layer using a platinum group metal.

In the present invention, a lattice oxygen obtained from carbon monoxide (CO) that is absorbed in a material for an electrode is preferably used for oxidation.

Figure 3:
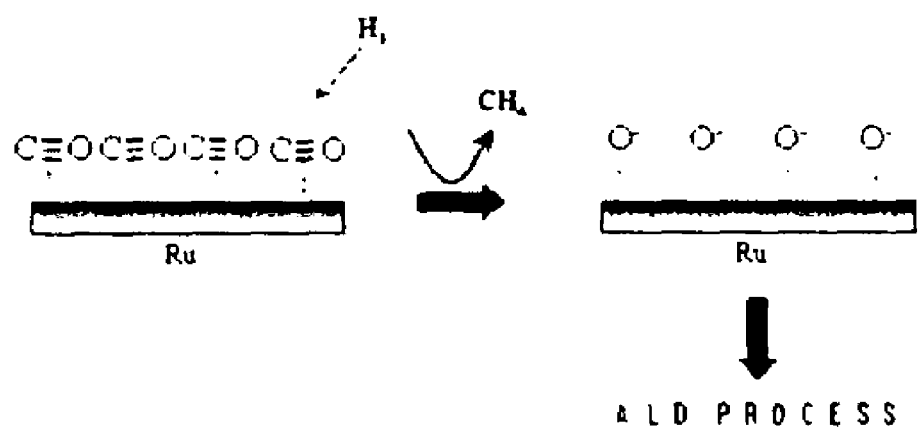
FIG. 3 illustrates a view for explaining a process in which carbon monoxide (CO) absorbed on the surface of a Ru electrode changes into a lattice oxygen, in accordance with the present invention.

FIG. 3 illustrates a view for explaining a process of producing lattice oxygen when a Ru electrode is used. Referring to FIG. 3, CO absorbed on the Ru electrode is placed under a reducing atmosphere and the carbon in the CO is removed in the form of $CH_4$. Thus, only lattice oxygen remains on the surface of Ru electrode. The lattice oxygen remaining on the surface of the Ru electrode is used as an oxidizer when a thin dielectric layer is formed by the ALD process in a subsequent procedure.

A method of fabricating a capacitor for use in a semiconductor device according to the present invention, using the lattice oxygen, will now be described.

First, CO is absorbed on the surface of a lower electrode made of an element of a platinum group metal. Next, the resultant is placed under a reducing atmosphere to produce lattice oxygen. To this end, the temperature may be maintained at about between 100–500° C. This is because CO is difficult to reduce if the temperature is lower than 100° C., and CO is more easily desorbed from the surface of a lower electrode carbon if the process temperature is higher than 500° C. The reducing atmosphere is formed using a reducing gas such as hydrogen.

Thereafter, using the lattice oxygen, a thin dielectric layer is formed by performing the ALD process using a precursor for a thin dielectric layer. A method of forming the thin dielectric layer and the required materials are as described above.

Then, a capacitor for use in a semiconductor device according to the present invention is completed by forming an upper electrode by forming an element of a platinum group metal on the thin dielectric layer.

Such a capacitor may be applied to various electronic devices such as a dynamic RAM (DRAM) device and non-volatile memory (FRAM).

Figure 4A:
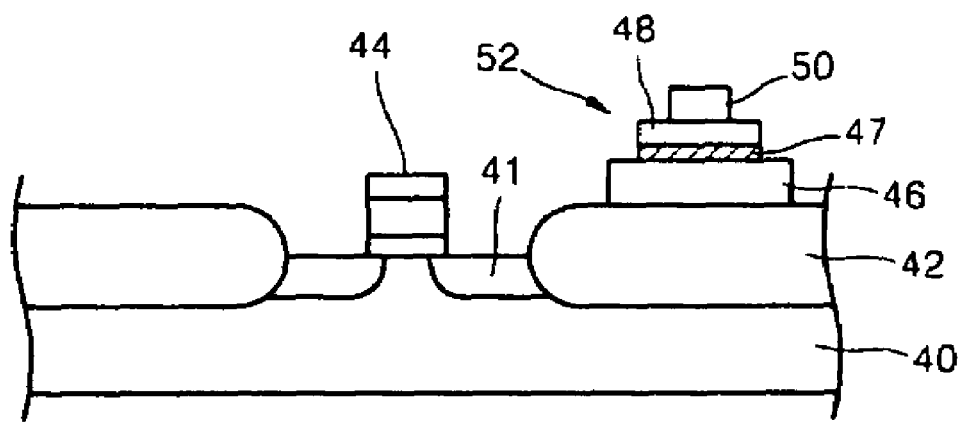
FIGS. 4A through 4C illustrate cross-sectional views showing embodiments of a memory device employing a capacitor according to the present invention.
Figure 4B:
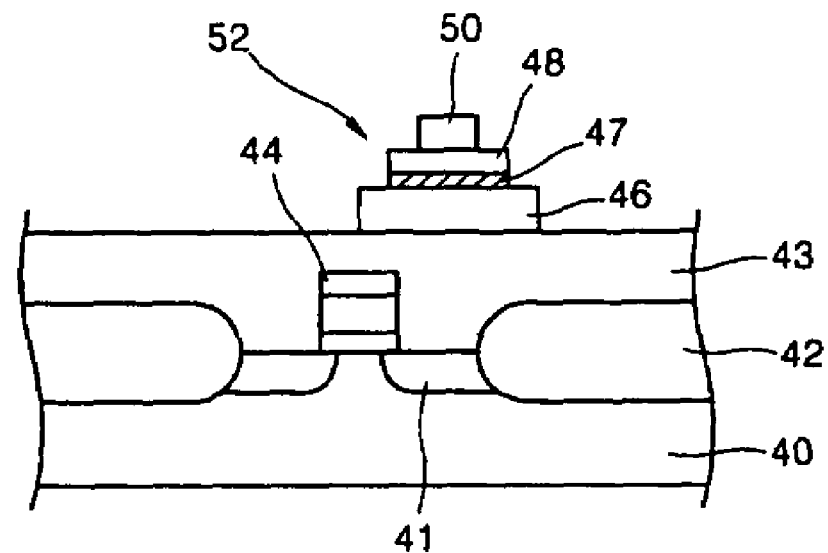
Figure 4C:
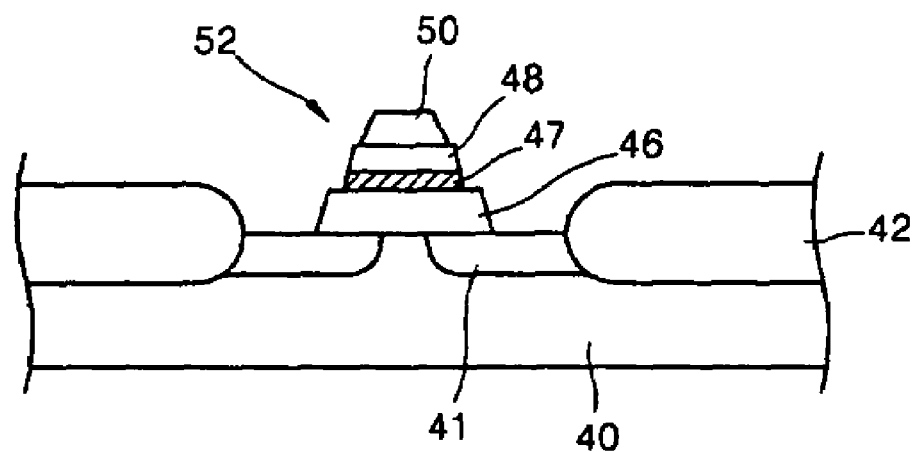

FIGS. 4A through 4C illustrate cross-sectional views of several forms memory devices adopting a capacitor according to the present invention. Specifically, FIG. 4A illustrates a cross-sectional view of a memory device of a single transistor type, FIG. 4B illustrates a cross sectional view of a one transistor, one capacitor (1Tr-1C) type memory device, and FIG. 4C illustrates a cross sectional view of a 1Tr-1C capacitor over bit line (COB)-type memory device.

In FIGS. 4A–4C, reference numeral '40' denotes a silicon substrate, '41' denotes an active region, '42' denotes a non-active region, '43' denotes a lower structure, '44' denotes a gate electrode, '45' denotes a polysilicon layer, '46' denotes a lower electrode, '47' denotes a buffer layer of $TiO_2$, '48' denotes a thin dielectric layer of $SrTiO_3$, '50' denotes an upper electrode, and '52' denotes a capacitor.

In FIGS. 4A through 4C, various memory devices adopting a preferred embodiment of a capacitor according to the present invention are illustrated, but such a capacitor may be applied to other electronic devices having a thin dielectric layer.

Hereinafter, a capacitor according to an embodiment of the present invention will be specifically described by the following exemplary embodiments.

<First Embodiment>

An atomic layer deposition (ALD) process was performed at about 325° C. using 0.1M of $Ti(i\text{-}OPr)_2(tmhd)_2$ dissolved in tetrahydrofuran (THF) and using $O_3$ as an oxidizer to form a buffer layer of $TiO_2$ on a first Ru electrode.

Then, the ALD process was performed on the buffer layer at about 400° C., using $Sr(mdthd)_2$ and $Ti(i\text{-}OPr)_2(tmhd)_2$ as a precursor and $O_3$ as an oxidizer to form a thin dielectric layer of $SrTiO_3$.

Next, a second Ru electrode was formed on the thin dielectric layer of $SrTiO_3$, thereby completing a capacitor.

<Second Embodiment>

A capacitor was prepared in the same manner as in the first embodiment, except that the ALD process was performed at about 400° C. with $Al(CH_3)_3$ as a precursor for a buffer layer and $O_3$ as an oxidizer to form a buffer layer of $Al_2O_3$ on a second Ru electrode.

<Third Embodiment>

CO was absorbed on the surface of a first Ru electrode and processed under a hydrogen gas atmosphere at about 400° C. to produce lattice oxygen. Then, a thin dielectric layer of $SrTiO_3$ was prepared in the same manner as in the first embodiment.

Then, a second Ru electrode was formed on the thin dielectric layer of $SrTiO_3$, thereby completing a capacitor.

Figure 5:
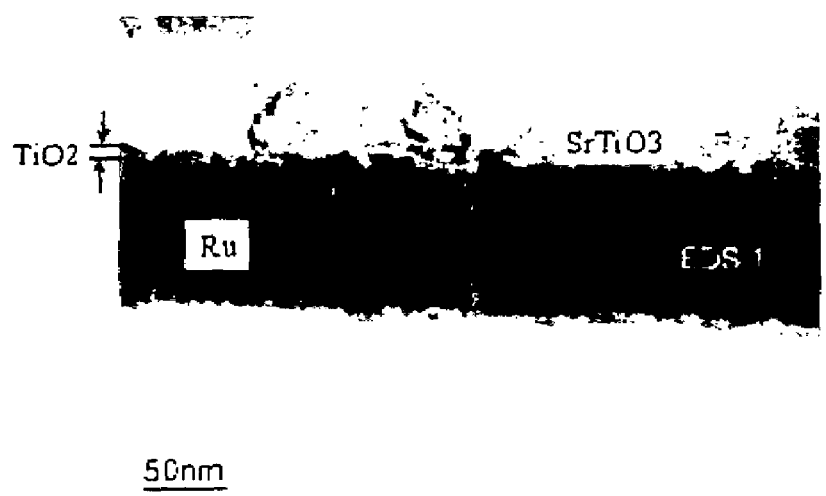
FIG. 5 is a photograph taken by a transmission electron microscope (TEM) of an $SrTiO_3$ thin layer of a capacitor according to one embodiment of the present invention.

FIG. 5 illustrates the laminated cross-section of a thin dielectric layer of $SrTiO_3$ formed on the Ru thin layer according to the first embodiment taken by a transmission electronic microscope (TEM).

Referring to FIG. 5, the buffer layer of $TiO_2$ is formed below the thin layer of $SrTiO_3$, and the Ru electrode is positioned under the buffer layer of $TiO_2$. It is noted that a protrusion is not formed in the Ru electrode.

Figure 6:
FIG. 6 is a photograph taken by a scanning electron microscope (SEM) of an $SrTiO_3$ thin layer of a capacitor according to another embodiment of the present invention.

FIG. 6 is a photograph of the laminated cross-section of the thin dielectric layer of $SrTiO_3$ formed on the Ru thin layer according to the second embodiment of the present invention, taken by a scanning electronic microscope (SEM).

From FIG. 6, it is noted that, due to the buffer layer, a protrusion does not occur in the Ru electrode, and roughness of the surface of the capacitor does not increase when a thin dielectric layer of $SrTiO_3$ is deposited.

Figure 7A:
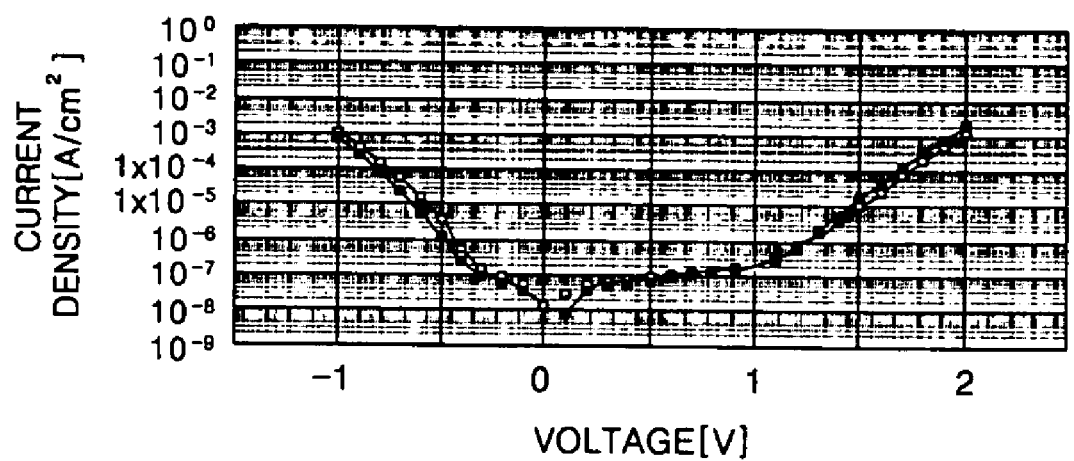
FIGS. 7A and 7B are graphs illustrating the electrical characteristics of a capacitor according to still another embodiment of the present invention.
Figure 7B:
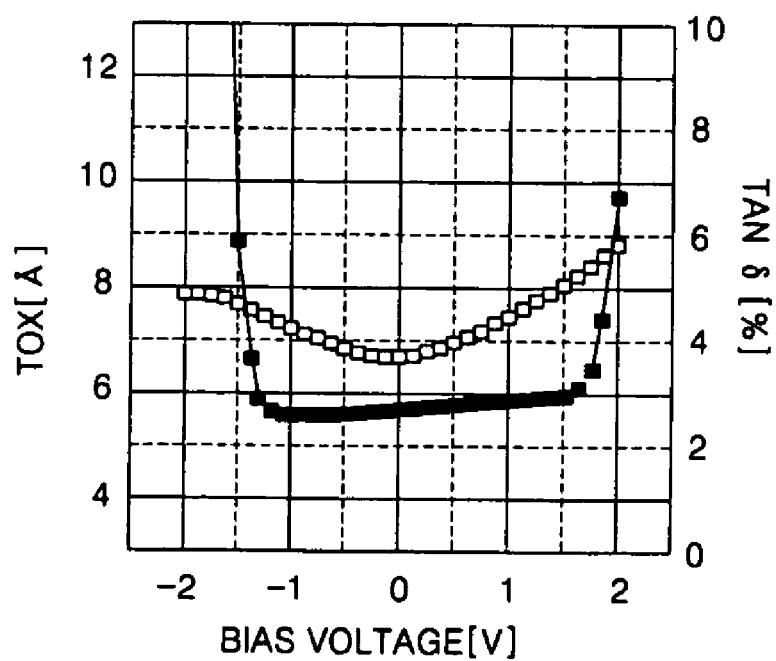

FIGS. 7A and 7B are graphs illustrating the electrical characteristics of the capacitor made according to the third embodiment of the present invention. Specifically, FIG. 7A illustrates variations in the current density according to voltage in the capacitor. FIG. 7A reveals that $10^{-7}$ $A/cm^2$ at 1V, which is the standard set for a DRAM, is generally satisfied by the capacitor prepared in the third embodiment. FIG. 7B shows variations in $t_{ox}$ according to bias voltage. Here, '$t_{ox}$' is a thickness of $SiO_2$, and may be expressed by the following general equation:

$$t_{ox} = \{(\text{a dielectric constant of SiO2})(\text{an area of an upper electrode in a capacitor})\}/\{\text{a capacitance of the capacitor}\}.$$

A smaller value of $t_{ox}$ indicates a higher quality dielectric layer.

In FIG. 7A, a white tetragonal symbol indicates variations in the current density as voltage in the capacitor is changed from a negative value to a positive value. A black tetragonal symbol indicates variations in the current density as voltage in the capacitor is changed from a positive value to a negative value. In FIG. 7B, a white tetragonal symbol indicates $t_{ox}$ according to a bias voltage, and a black tetragonal symbol indicates a dielectric loss factor (TAN δ).

Referring to FIG. 7B, the $t_{ox}$ of a dielectric layer is 6.8 Å just after being deposited, and is 7 Å at a bias voltage of 1V, which is the $t_{ox}$ of a dielectric layer required for a DRAM of more than 16 Gigabytes.

As described above, in a capacitor according to the present invention, oxidization of a lower Ru electrode may be suppressed even when forming a thin dielectric layer by performing an ALD process with a strong oxidizer such as $O_3$. By suppressing oxidization, deformation of the lower Ru electrode may be prevented, and deterioration of the characteristics of the thin dielectric layer may be inhibited. Accordingly, a capacitor according to the present invention retains the excellent electrical characteristics of a thin dielectric layer as required by a highly integrated memory, and therefore may be used in an electronic device such as a DRAM.

Preferred embodiments of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a capacitor comprising:
   absorbing CO on a surface of a lower electrode of a platinum group metal;
   placing the lower electrode under a reducing atmosphere to produce a lattice oxygen;
   using the lattice oxygen to form a thin dielectric layer by performing an ALD process using a precursor for the thin dielectric layer; and
   forming an upper electrode of a platinum group metal on the thin dielectric layer.

2. The method as claimed in claim 1, wherein the precursor for the thin dielectric layer is comprised of at least one selected from the group consisting of $Sr(tmhd)_2$, $Sr(methd)_2$, $TiO(tmhd)_2$, and $Ti(i\text{-}OPr)_2(tmhd)_2$, (where tmhd indicates tetramethylheptanedionate, methd indicates methoxyethoxy tetramethylheptanedionate and i-OPr indicates isopropoxy).

3. The method as claimed in claim 1, wherein the reducing atmosphere is maintained at a temperature of between about 100–500° C.

* * * * *